US012731248B2

(12) United States Patent
Watras et al.

(10) Patent No.: US 12,731,248 B2
(45) Date of Patent: Sep. 8, 2026

(54) SYSTEM AND METHOD FOR DEFECT DETECTION USING A CONDITIONAL MASKED AUTOENCODER

(71) Applicant: KLA Corporation, Milpitas, CA (US)

(72) Inventors: Alex Watras, Mountain View, CA (US); Hawren Fang, San Jose, CA (US); Huan Jin, Dublin, CA (US); Mohammadreza Ravanfar, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/999,461

(22) Filed: Dec. 23, 2024

(65) Prior Publication Data

US 2025/0356480 A1 Nov. 20, 2025

Related U.S. Application Data

(60) Provisional application No. 63/708,759, filed on Oct. 18, 2024, provisional application No. 63/648,172, filed on May 16, 2024.

(51) Int. Cl.
*G06T 7/00* (2017.01)
*G06N 3/045* (2023.01)
(Continued)

(52) U.S. Cl.
CPC ............. *G06T 7/001* (2013.01); *G06N 3/045* (2023.01); *G06T 7/11* (2017.01); *G06N 3/0455* (2023.01);
(Continued)

(58) Field of Classification Search
CPC ... G06T 7/001; G06T 7/11; G06T 5/70; G06T 7/0004; G06T 2207/10061;
(Continued)

(56) References Cited

U.S. PATENT DOCUMENTS 10,733,722 B2 8/2020 Niculescu-Mizil et al.
11,239,048 B2 2/2022 Brodie et al.
(Continued)

FOREIGN PATENT DOCUMENTS

CN 116523985 A * 8/2023 ............... G06T 7/40
CN 117115095 A * 11/2023 ........... G06T 7/0004
(Continued)

OTHER PUBLICATIONS

He et al. He, Kaiming, et al. "Masked autoencoders are scalable vision learners." Proceedings of the IEEE/CVF conference on computer vision and pattern recognition. 2022. (Also cited as U.S. Pat. No. 20240096072 A1). (Year: 2022).*
(Continued)

*Primary Examiner* — Ross Varndell
(74) *Attorney, Agent, or Firm* — Suiter Swantz IP

(57) ABSTRACT

A method for defect detection includes receiving an optical image of a sample and dividing the received optical image include a plurality of image patches. The method includes generating a masked optical image by selectively masking the image patches based on characterization data. The method includes providing the masked optical image to a first encoder. The method includes receiving a design image and providing it to a second encoder. The method includes generating a first set of feature vectors using the first encoder and generating a second set of feature vectors using the second encoder. The method includes concatenating the feature vectors from the first encoder and the feature vectors from the second encoder and generating a reference image of the sample based on the concatenated feature vectors using a decoder, where the generated reference image is a reconstructed image of the optical image and the design image.

25 Claims, 5 Drawing Sheets

(51) Int. Cl.

| | |
|---|---|
| ***G06N 3/0455*** | (2023.01) |
| ***G06T 5/70*** | (2024.01) |
| ***G06T 7/11*** | (2017.01) |
| ***G06V 10/82*** | (2022.01) |
| ***H10P 72/00*** | (2026.01) |

(52) U.S. Cl.
CPC .............. *G06T 5/70* (2024.01); *G06T 7/0004* (2013.01); *G06T 2207/10061* (2013.01); *G06T 2207/20021* (2013.01); *G06T 2207/20084* (2013.01); *G06T 2207/30148* (2013.01); *G06V 10/82* (2022.01); *H10P 72/00* (2026.01)

(58) Field of Classification Search
CPC . G06T 2207/20021; G06T 2207/20084; G06T 2207/30148; G06N 3/045; G06N 3/0455; G06V 10/82; H01L 21/67
See application file for complete search history.

(56) References Cited

U.S. PATENT DOCUMENTS

| | | | | |
|---|---|---|---|---|
| 11,410,830 | B1 | 8/2022 | Xiao et al. | |
| 11,880,193 | B2 | 1/2024 | Yati et al. | |
| 2018/0374207 | A1* | 12/2018 | Niculescu-Mizil | G06T 7/0004 |
| 2021/0026338 | A1* | 1/2021 | Yati | G06T 7/0008 |
| 2022/0108862 | A1 | 4/2022 | Chubun et al. | |
| 2022/0309637 | A1 | 9/2022 | Checka et al. | |
| 2024/0013564 | A1* | 1/2024 | Kim | G06V 10/454 |
| 2024/0096072 | A1* | 3/2024 | He | G06V 10/26 |
| 2024/0194440 | A1 | 6/2024 | Jiang et al. | |
| 2024/0311987 | A1* | 9/2024 | Schwartz | G06N 3/0455 |
| 2025/0118054 | A1* | 4/2025 | Altam | G06V 10/62 |

FOREIGN PATENT DOCUMENTS

| | | | | | |
|---|---|---|---|---|---|
| CN | 117455902 | A | * | 1/2024 | G06T 7/0004 |
| CN | 118014047 | A | | 5/2024 | |
| CN | 118262045 | A | * | 6/2024 | G06N 3/08 |
| WO | 2023221043 | A1 | | 11/2023 | |
| WO | WO-2024068203 | A1 | * | 4/2024 | G05B 19/41875 |

OTHER PUBLICATIONS

Lu, Hu, et al. "A masked autoencoder-based approach for defect classification in semiconductor manufacturing." 2023 International Workshop on Advanced Patterning Solutions (IWAPS). IEEE, 2023. (Year: 2023).*

He et al., "Masked Autoencoders are Scalable Vision Learners," Facebook AI Research, Dec. 19, 2021, 10 pages.

Korean Intellectual Property Office, International Search Report and Written Opinion received in International Application No. PCT/US2025/025501, Aug. 12, 2025, 7 pages.

Lu et al., "A masked autoencoder-based approach for defect classification in semiconductor manufacturing," International Workshop on Advanced Patterning Solutions (IWAPS), Oct. 27, 2023, 4 pages.

* cited by examiner

SYSTEM AND METHOD FOR DEFECT DETECTION USING A CONDITIONAL MASKED AUTOENCODER

CROSS-REFERENCE TO RELATED APPLICATIONS

The present application claims the benefit of U.S. Provisional Application No. 63/648,172, filed May 16, 2024; and U.S. Provisional Application No. 63/708,759, filed Oct. 18, 2024, which are both incorporated herein by reference in their entirety.

TECHNICAL FIELD

The present disclosure relates generally to sample inspection and, more particularly, to a system and method for sample defect detection using a conditional masked autoencoder.

BACKGROUND

Demand for electronic logic and memory devices with ever-smaller footprints and features present a wide range of manufacturing challenges beyond fabrication at a desired scale. In the context of semiconductor fabrication, predicting and removing defects from semiconductor devices is an important step in improving throughput and yield. One of the primary challenges in identifying defects is the inability to predict the location, type, and structure of defects accurately.

Optical image modeling is often used to identify defects. Existing methods for optical image modeling include physics-based approaches, deep convolutional neural networks, or a combination thereof. Such methods have limitations such as high computational costs and the inability to handle images of different modalities (e.g., design image and inspection images).

Therefore, it is desirable to provide systems and methods for curing one or more of the above deficiencies.

SUMMARY

A system for detecting defects on a sample is disclosed, in accordance with one or more embodiments of the present disclosure. In embodiments, the system includes a controller including one or more processors configured to execute a set of program instructions stored in memory, where a conditional masked autoencoder is stored in the memory. In embodiments, the set of program instructions are configured to cause the one or more processors to: receive an optical image; generate a plurality of image patches by dividing the received optical image include the plurality of image patches; generate a masked optical image by selectively masking a first set of image patches of the plurality of image patches based on characterization data, where the first set of image patches correspond to one or more defect regions, where the plurality of image patches includes a second set of image patches corresponding to one or more defect free regions; provide the generated masked optical image to a first encoder of the conditional masked autoencoder; apply the first encoder to the second set of image patches of the generated masked optical image to generate a first set of feature vectors; receive a design image; provide the design image to a second encoder of the conditional masked autoencoder; apply the second encoder to the design image to generate a second set of feature vectors; concatenating the first set of feature vectors from the first encoder and the second set of feature vectors from the second encoder; and generate a reference image based on the concatenated feature vectors using a decoder of the conditional masked autoencoder, where the generated reference image is a reconstructed image of the optical image and the design image.

A system for detecting defects on a sample is disclosed, in accordance with one or more embodiments of the present disclosure. In embodiments, the system includes an optical sub-system configured to acquire a plurality of optical images of the sample. In embodiments, the system includes a controller communicatively coupled to the optical sub-system, where the controller includes one or more processors configured to execute a set of program instructions stored in memory, and where a conditional masked autoencoder is stored in the memory. In embodiments, the set of program instructions are configured to cause the one or more processors to: receive an optical image of the plurality of optical images from the optical sub-system; generate a plurality of image patches by dividing the received optical image include the plurality of image patches; generate a masked optical image by selectively masking a first set of image patches of the plurality of image patches based on characterization data, where the first set of image patches correspond to one or more defect regions, where the plurality of image patches includes a second set of image patches corresponding to one or more defect free regions; provide the generated masked optical image to a first encoder of the conditional masked autoencoder; apply the first encoder to the second set of image patches of the generated masked optical image to generate a first set of feature vectors; receive a design image; provide the design image to a second encoder of the conditional masked autoencoder; apply the second encoder to the design image to generate a second set of feature vectors; concatenate the first set of feature vectors from the first encoder and the second set of feature vectors from the second encoder; and generate a reference image based on the concatenated feature vectors using a decoder of the conditional masked autoencoder, where the generated reference image is a reconstructed image of the optical image and the design image.

A method for defect detection is disclosed, in accordance with one or more embodiments of the present disclosure. In embodiments, the method includes receiving an optical image of a sample. In embodiments, the method includes generating a plurality of image patches by dividing the received optical image include the plurality of image patches. In embodiments, the method includes generating a masked optical image by selectively masking a first set of image patches of the plurality of image patches based on characterization data, where the first set of image patches correspond to one or more defect regions, and where the plurality of image patches includes a second set of image patches corresponding to one or more defect free regions. In embodiments, the method includes providing the generated masked optical image to a first encoder of a conditional masked autoencoder. In embodiments, the method includes applying the first encoder to the second set of image patches of the generated masked optical image to generate a first set of feature vectors; receiving a design image. In embodiments, the method includes providing the design image to a second encoder of the conditional masked autoencoder; applying the second encoder to the design image to generate a second set of feature vectors. In embodiments, the method includes concatenating the first set of feature vectors from the first encoder and the second set of feature vectors from the second encoder. In embodiments, the method includes generating a reference image of the sample based on the concatenated feature vectors using a decoder of the conditional masked autoencoder, where the generated reference image is a reconstructed image of the optical image and the design image.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
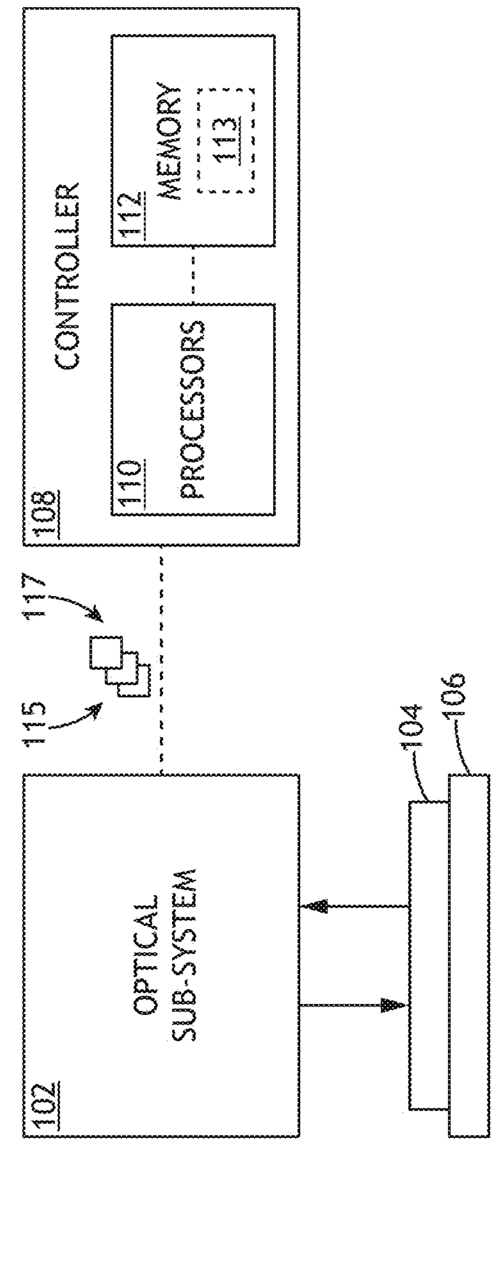
FIG. 1 illustrates a block diagram view of a system for defect detection, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a system and method for defect detection using a conditional masked autoencoder (MAE). For example, the defect detection system and method may utilize the conditional MAE for reference image generation for defect detection (e.g., die-to-database (D2DB) defect detection), where the reference image is robust to process variation. The conditional MAE may include at least two encoders, where a first encoder is leveraged for optical images (e.g., scanning electron microscope (SEM) images) and a second encoder is leveraged for design images. The conditional MAE may utilize targeted masking during the inference phase to specify which portion of the image should be generated. For example, target location information may be provided by an optical sub-system (e.g., broadband plasma inspection sub-system) and used to specify which portions of the image should be generated and which should be treated as a defect free reference. In this regard, the conditional MAE may use the defect free regions to learn how to perform the design to SEM generation task and generate a reference image corresponding to the inspection area. The reconstructed SEM image may utilize the optical image (or test image) for all non-masked patches (e.g., defect free regions) and masked patches (e.g., defect regions) may be replaced with the generated SEM data.

It is contemplated herein that the system and method of the present disclosure may provide a number of advantages over previous approaches. For example, the system and method of the present disclosure may consider images with at least two modalities. By way of another example, the conditional MAE of the present disclosure may be configured to learn to estimate color and shape variation from the optical image to better perform the Design to SEM mapping needed for reference generation. By way of another example, the reference image generated using the system and method of the present disclosure may only differ from the optical image in the location labeled as possibly containing defect. Further, the conditional MAE of the present disclosure can natively leverage the location filters, which may be available in a review sub-system, to improve downstream defect detection performance.

Referring now to FIGS. 1-5, systems and methods for defect detection using a conditional masked autoencoder (MAE) are described in greater detail in accordance with one or more embodiments of the present disclosure.

FIG. 1 illustrates a block diagram view of a system 100 for defect detection, in accordance with one or more embodiments of the present disclosure. In embodiments, the system 100 includes an optical sub-system 102 and a controller 108 communicatively coupled to the optical sub-system 102.

The optical sub-system 102 may be configured to inspect and/or image a sample 104 secured on a sample stage 106. The optical sub-system 102 may include any optical-based characterization system. For example, the optical sub-system 102 may include a scanning electron microscopy (SEM) inspection system. For instance, the SEM inspection system may be configured for optical die-to-database inspection of samples 104, where the SEM inspection system may be configured to compare an optical image of a sample (or wafer) to a rendered image generated from a database to detect defects on the sample.

The controller 108 may include one or more processors 110 and memory 112. The one or more processors 110 may be configured to execute a set of program instructions maintained in the memory 112. The one or more processors 110 of controller 108 may be configured to apply the conditional MAE 113 to generate a reference image for use in die-to-database inspection to detect defects on the sample 104. For example, the conditional MAE 113 may be stored in memory 112.

It is contemplated herein that the conditional MAE 113 may be any type of deep learning model. For example, the conditional MAE 113 may be a self-supervised deep learning model including at least two vision transformer (ViT) encoders and a decoder. For instance, the at least two ViT encoders may consider images of different modalities (e.g., design images and optical (or SEM) images).

In embodiments, the one or more processors 110 may be configured to receive one or more optical images 115 of the sample 104. For example, the one or more processors 110 may be configured to receive one or more optical images 115 from the optical sub-system 102. For instance, the one or more processors 110 may be configured to receive one or more SEM images 115 from the SEM inspection sub-system

200. For purposes of the present disclosure, "optical images", "test images", "SEM images", or variations thereof, may refer to optical images of the physical sample (e.g., wafer) acquired using the optical sub-system (e.g., SEM inspection system).

In embodiments, the one or more processors 110 may be configured to receive one or more design images 117 of the sample 104. The one or more design images 117 may include design data that generally refers to the physical design (or layout) of the sample and/or data derived from the physical design through simulation or modelling. For purposes of the present disclosure, "design images" may refer to design images that correspond to the physical design (or layout) of a semiconductor device.

In embodiments, the one or more processors 110 may be configured to selectively mask the one or more optical images 115 of the sample 104. For example, the one or more processors 110 may be configured to break up the one or more optical images 115 into a plurality of patches and selectively mask respective patches corresponding to one or more defect regions. For instance, the one or more processors 110 may be configured to receive inspection data from an inspection sub-system, where the inspection data indicates the location of one or more defects. In this regard, patches with pixels labeled as defects by the inspection sub-system may correspond to defect regions, such that corresponding patches may be selectively masked.

In embodiments, the one or more processors 110 may be configured to generate a reference image using the conditional MAE. For example, the one or more processors 110 may be configured to apply a first encoder of the conditional MAE to the masked optical images and a second encoder of the conditional MAE to the design images. By way of another example, the one or more processors 110 may be configured to map the design and optical images based on the outputs from the first and second encoders and then generate a reference image corresponding to the inspection area using a decoder.

The sample 104 may include any sample known in the art including, but not limited to, a wafer, a reticle, a photomask, flat panel display, and the like. In embodiments, the sample 104 is disposed on the stage assembly 106 to facilitate movement of the sample 104. For example, the stage assembly 106 may include an actuatable stage. For instance, the stage assembly 106 may include, but is not limited to, one or more translational stages suitable for selectively translating the sample 104 along one or more linear directions (e.g., x-direction, y-direction and/or z-direction). By way of another example, the stage assembly 106 may include, but is not limited to, one or more rotational stages suitable for selectively rotating the sample 104 along a rotational direction. By way of another example, the stage assembly 106 may include, but is not limited to, a rotational stage and a translational stage suitable for selectively translating the sample 104 along a linear direction and/or rotating the sample 104 along a rotational direction. It is noted herein that the system 100 may operate in any scanning mode known in the art.

Figure 2:
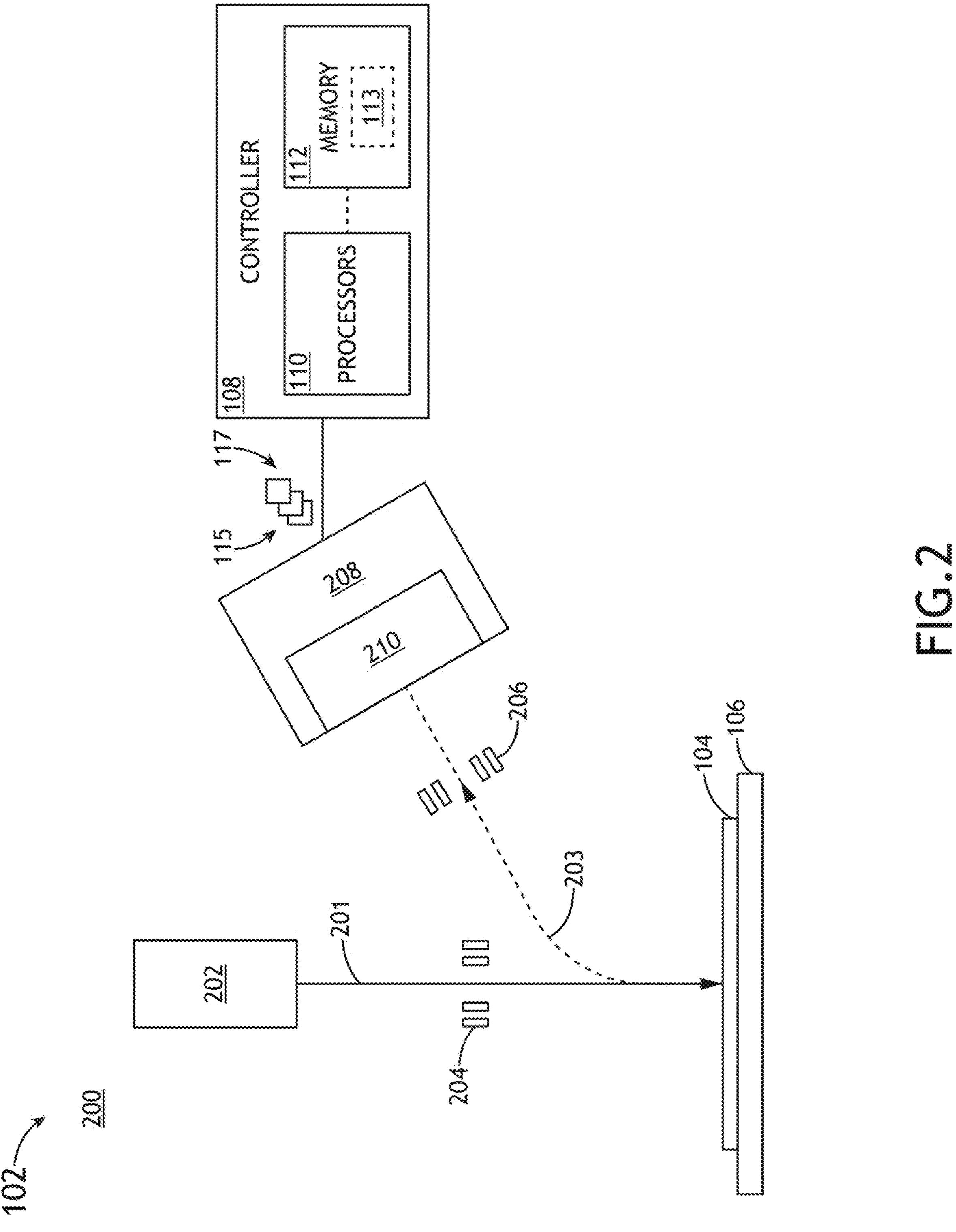
FIG. 2 illustrates a simplified schematic view of an SEM-based characterization sub-system of the system for defect detection, in accordance with one or more embodiments of the present disclosure.

FIG. 2 illustrates a simplified schematic view of the optical sub-system 102, in accordance with one or more embodiments of the present disclosure.

In embodiments, the optical sub-system 102 includes an SEM inspection sub-system 200 configured to perform inspection of the sample 104. In this regard, the SEM inspection sub-system 200 may be configured to acquire one or more optical images of the sample 104. The SEM inspection sub-system 200 may include, but is not limited to, an electron beam source 202, one or more electron-optical elements 204, one or more collection electron-optical elements 206, and an electron detector assembly 208 including one or more electron sensors 210. In embodiments, the electron beam source 202 is configured to direct one or more electron beams 201 to the sample 104. The electron-optical elements 204 may form an electron-optical column. In embodiments, the system 100 may include one or more additional and/or alternative electron-optical elements 204 configured to focus and/or direct the one or more electron beams 201 to the surface of the sample 104. The one or more electron-optical elements 206 may be configured to collect secondary and/or backscattered electrons 203 emanated from the surface of the sample 104 in response to the one or more electron beams 201. It is noted herein that the one or more electron-optical elements 204 and the one or more electron-optical elements 206 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic condenser lenses), and the like.

It is noted that the electron optical assembly of the SEM inspection sub-system 200 is not limited to the electron-optical elements depicted in FIG. 2, which is provided merely for illustrative purposes. It is further noted that the system 100 may include any number and type of electron-optical elements necessary to direct/focus the one or more electron beams 201 onto the sample 104 and, in response, collect and image the emanated secondary and/or backscattered electrons 203 onto the electron detector assembly 208.

SEM inspection sub-systems are generally discussed in U.S. Pat. No. 11,239,048, issued Feb. 1, 2022; U.S. Pat. No. 11,410,830, issued Aug. 9, 2022; U.S. Patent Publication No. 2024/0194440, published Jun. 13, 2024; U.S. Patent Publication No. 2022/0108862, published Apr. 7, 2022; and U.S. Pat. No. 11,880,193, issued Jan. 23, 2024, all of which are incorporated by reference in their entirety.

Figure 3:
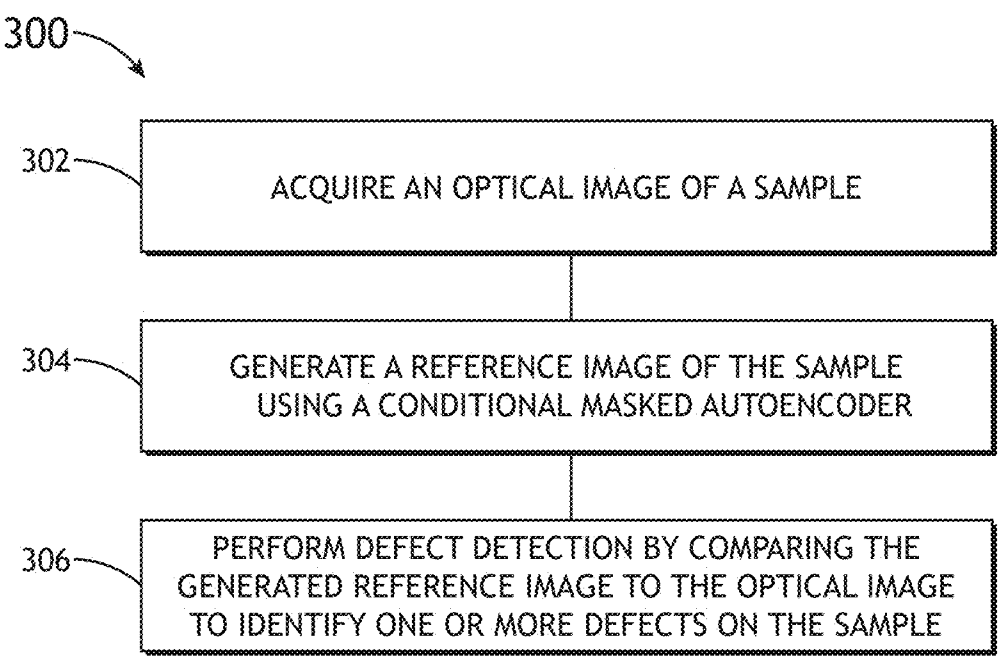
FIG. 3 illustrates a flow diagram illustrating a method for defect detection using a conditional MAE, in accordance with one or more embodiments of the present disclosure.

FIG. 3 illustrates a flow diagram depicting a method 300 of defect detection, in accordance with one or more embodiments of the present disclosure. It is noted herein that the embodiments and enabling technologies described previously herein in the context of the system 100 should be interpreted to extend to the method 300. It is further noted, however, that the method 300 is not limited to the architecture of the system 100.

In embodiments, the method 300 includes a step 302 of receiving one or more optical images of a sample. For example, the one or more processors 110 may be configured to receive one or more optical images from the optical sub-system 102 (or other system). For instance, the one or more processors 110 may be configured to receive one or more SEM images from the SEM inspection sub-system 200.

In embodiments, the method 300 includes a step 304 of generating a reference image of the sample using the conditional MAE, as will be discussed in more detail below. For example, the one or more processors 110 may be configured to generate a reference image of the sample using the conditional MAE stored in memory 112. The conditional MAE may include at least two vision transformer encoders and a decoder. For example, the at least two encoders may include at least a first encoder that leverages the optical (or SEM) images and a second encoder that leverages the design images, such that the at least two encoders consider images of different modalities. In this regard, the resulting generated reference image (e.g., SEM image) may be robust to process variation and be generated based on the inspection area.

In embodiments, the method 300 includes a step 306 of performing defect detection on the sample. For example, the one or more processors 110 may be configured to compare the generated reference image to the optical image to identify one or more defects on the sample 104.

Figure 4:
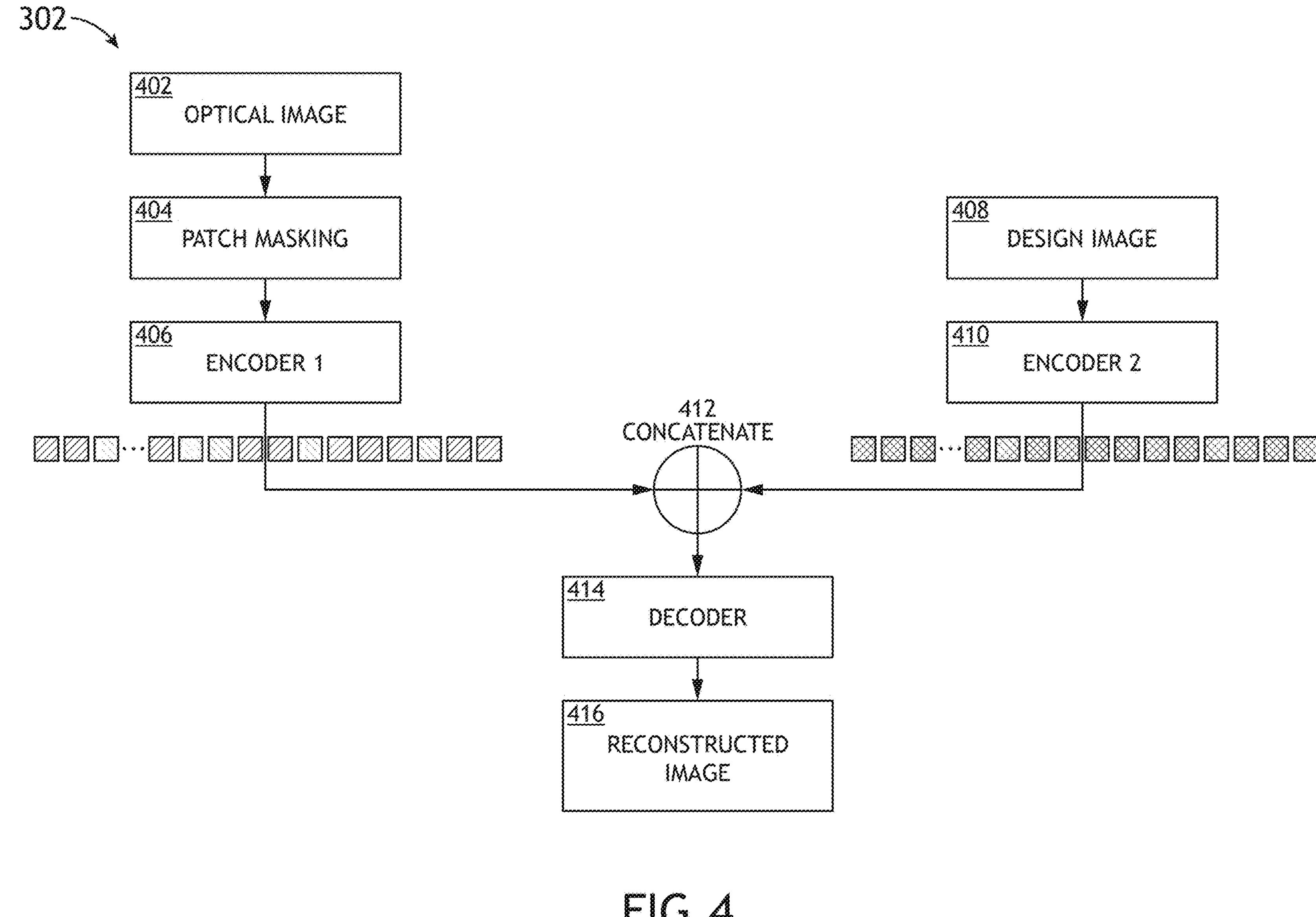
FIG. 4 illustrates a conceptual flow diagram depicting the method for reference image generation using the conditional MAE, in accordance with one or more embodiments of the present disclosure.

FIG. 4 illustrates a conceptual flow diagram depicting the method 304 of generating a reference image using the conditional MAE, in accordance with one or more embodiments of the present disclosure.

In embodiments, the method 304 includes a step 402 of receiving one or more optical images 115. For example, the one or more processors 110 may be configured to receive one or more optical images 115 of the sample 104. For instance, the one or more processors 110 may be configured to receive one or more SEM images 115 from the SEM inspection system 200. It is contemplated herein that the optical images received in step 302 may be the same as the optical images 115 received in step 402 or may be different.

In embodiments, the method 304 includes a step 404 of selectively masking the received one or more optical images 115. For example, the one or more processors 110 may be configured to divide each optical image 115 into patches (e.g., regular, non-overlapping patches). Each optical image 115 may have a patch size between approximately 16×16 to 32×32 pixels. For example, in a non-limiting example, each optical image 115 may have a patch size of 16×16. By way of another example, in a non-limiting example, each optical image 115 may have a patch size of 14×14. By way of another example, in a non-limiting example, each optical image 115 may have a patch size of 28×28. By way of another example, in a non-limiting example, each optical image 115 may have a patch size of 32×32.

Figure 5:
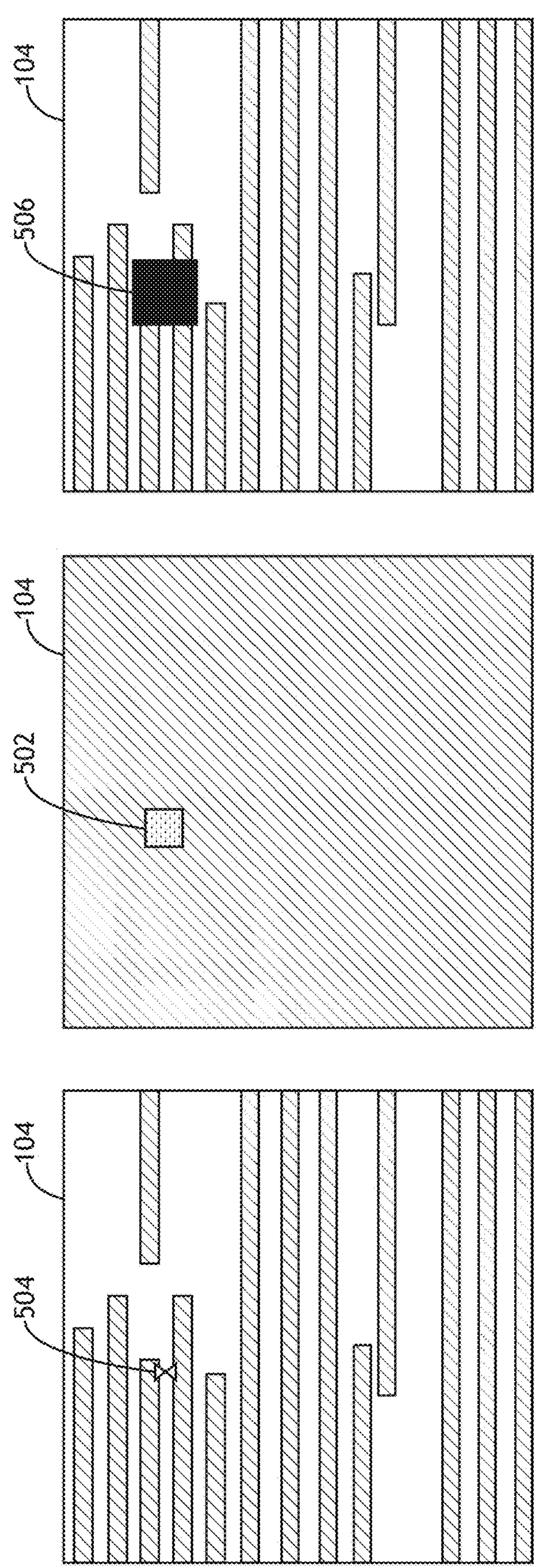
FIG. 5 illustrates a conceptual flow diagram depicting the method for selective masking, in accordance with one or more embodiments of the present disclosure.

In embodiments, the one or more processors 110 may be configured to selectively mask the plurality of patches based on characterization data. FIG. 5 illustrates a conceptual flow diagram depicting the method for selective masking, in accordance with one or more embodiments of the present disclosure. In embodiments, a first set of image patches corresponding to one or more defect regions may be selectively masked. For example, the one or more processors 110 may be configured to receive one or more defect labels 502 from an inspection system (e.g., broadband plasma (BBP) inspection system), where a respective defect label 502 corresponds to a location where a defect 504 is located on the sample 104 (e.g., defect region). The one or more processors 110 may then selectively mask a respective patch 506 associated with the defect label 502. In this regard, patches 506 that have pixels labeled as defects 504 may be selectively masked.

In embodiments, the method 304 includes a step 406 of providing the masked optical image to a first encoder and applying the first encoder to the masked optical image to generate a plurality of feature vectors. For example, the one or more processors 110 may be configured to apply the first encoder to a second set of image patches corresponding to one or more defect free regions (e.g., un-masked portions of the image). In this regard, the resulting generated reference image (in step 416) utilizes the optical image (or SEM image) for all non-masked patches and the masked patches are replaced with generated SEM data.

In embodiments, the method 304 includes a step 408 of receiving one or more design images. For example, the one or more processors 110 may be configured to receive one or more design images 117 of the sample 104. The one or more design images 117 may include design data that generally refers to the physical design (or layout) of the sample and/or data derived from the physical design through simulation or modelling.

In embodiments, the method 304 includes a step 410 of providing the design image to a second encoder and applying the second encoder to the design image. For example, the one or more processors 110 may be configured to apply the second encoder (different than the first encoder) to the design image to generate a plurality of feature vectors.

In embodiments, the method 304 includes a step 412 of concatenating the feature vectors of the first encoder to the feature vectors of the second encoder. For example, the one or more processors 110 may be configured to concatenate the feature vectors produced by both encoders. For instance, the one or more processors 110 may be configured to generate a latent representation of the feature vectors, where the latent representation includes a single matrix that merges features from the SEM and design feature vectors.

In embodiments, the method 304 includes a step 414 of applying a decoder to the concatenated feature vectors. For example, the one or more processors 110 may be configured to receive the concatenated feature vectors produced by the two encoders and provide them as an input to the decoder.

In embodiments, the method 304 includes a step 416 of generating a reference image (or reconstructed image). For example, the one or more processors 110 may be configured to generate a reference image by using the optical image for all non-masked patches and replacing the masked patches with SEM data generated by the decoder. For instance, the one or more processors 110, using the decoder, may reconstruct the SEM image by utilizing feature vectors derived from both the design and the masked SEM. In this regard, the decoder is able to perform accurate image reconstruction.

Referring again to FIG. 1, additional components of the system 100 are described in greater detail in accordance with one or more embodiments of the present disclosure.

The one or more processors 110 of the controller 108 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In one embodiment, the one or more processors 110 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 108 may include one or more controllers housed in a common housing or within multiple housings. In this way, any controller or combination of controllers may be separately packaged as a module suitable for integration into metrology system 100. Further, the controller 108 may analyze or otherwise process data received from the optical sub-system 102 and feed the data to additional components within the system 100 or external to the system 100.

Further, the memory device 112 may include any storage medium known in the art suitable for storing program instructions executable by the associated one or more processors 110. For example, the memory device 112 may include a non-transitory memory medium. As an additional example, the memory device 112 may include, but is not limited to, a read-only memory, a random-access memory, a magnetic or optical memory device (e.g., disk), a magnetic tape, a solid-state drive and the like. It is further noted that memory device 112 may be housed in a common controller housing with the one or more processors 110.

In this regard, the controller 108 may execute any of various processing steps associated with characterization. For example, the controller 108 may be configured to generate control signals to direct or otherwise control the characterization sub-system 102, or any components thereof. For instance, the controller 108 may be configured to direct the stage 106 to translate the sample 104 along one or more measurement paths or swaths. By way of another example, the controller 108 may be configured to receive images from the optical sub-system 102. By way of another example, the controller 108 may generate correctables for one or more additional fabrication sub-systems as feedback and/or feed-forward control of the one or more additional fabrication sub-systems based on measurements from the optical sub-system 102.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A system for detecting defects on a sample, the system comprising:

a controller including one or more processors configured to execute a set of program instructions stored in memory, wherein a conditional masked autoencoder is stored in the memory, the set of program instructions configured to cause the one or more processors to:

receive an optical image;

generate a plurality of image patches by dividing the received optical image into the plurality of image patches;

generate a masked optical image by selectively masking a first set of image patches of the plurality of image patches based on characterization data, wherein the first set of image patches correspond to one or more defect regions, wherein the plurality of image patches includes a second set of image patches corresponding to one or more defect free regions;

provide the generated masked optical image to a first encoder of the conditional masked autoencoder;

apply the first encoder to the second set of image patches of the generated masked optical image to generate a first set of feature vectors;

receive a design image;

provide the design image to a second encoder of the conditional masked autoencoder;

apply the second encoder to the design image to generate a second set of feature vectors;

concatenate the first set of feature vectors from the first encoder and the second set of feature vectors from the second encoder; and generate a reference image based on the concatenated feature vectors using a decoder of the conditional masked autoencoder, wherein the generated reference image is a reconstructed image of the optical image and the design image.

2. The system of claim 1, wherein the set of program instructions are further configured to cause the one or more processors to:

identify one or more defects on the sample by comparing the generated reference image to a sample image.

3. The system of claim 1, wherein each image patch of the plurality of image patches has a patch size of 16×16 pixels.

4. The system of claim 1, wherein each image patch of the plurality of image patches has a patch size of 14×14 pixels.

5. The system of claim 1, wherein each image patch of the plurality of image patches has a patch size of 28×28 pixels.

6. The system of claim 1, wherein each image patch of the plurality of image patches has a patch size of 32×32 pixels.

7. The system of claim 1, wherein the characterization data includes defect inspection data from a broadband inspection system.

8. The system of claim 1, wherein the conditional masked autoencoder includes a self-supervised deep learning model.

9. The system of claim 8, wherein the first encoder and the second encoder include vision transformer encoders, wherein the decoder includes a vision transformer decoder.

10. The system of claim 1, further comprising:

an optical sub-system configured to acquire the optical image of the sample.

11. The system of claim 10, wherein the optical sub-system includes a scanning electron microscopy sub-system.

12. The system of claim 11, wherein the optical image includes a scanning electron microscope (SEM) image.

13. A system for detecting defects on a sample, the system comprising:

an optical sub-system configured to acquire a plurality of optical images of the sample; and a controller communicatively coupled to the optical sub-system, the controller includes one or more processors configured to execute a set of program instructions stored in memory, wherein a conditional masked autoencoder is stored in the memory, the set of program instructions configured to cause the one or more processors to:

receive an optical image of the plurality of optical images from the optical sub-system;

generate a plurality of image patches by dividing the received optical image into the plurality of image patches;

generate a masked optical image by selectively masking a first set of image patches of the plurality of image patches based on characterization data, wherein the first set of image patches correspond to one or more defect regions, wherein the plurality of image patches includes a second set of image patches corresponding to one or more defect free regions;

provide the generated masked optical image to a first encoder of the conditional masked autoencoder;

apply the first encoder to the second set of image patches of the generated masked optical image to generate a first set of feature vectors;

receive a design image;

provide the design image to a second encoder of the conditional masked autoencoder;

apply the second encoder to the design image to generate a second set of feature vectors;

concatenate the first set of feature vectors from the first encoder and the second set of feature vectors from the second encoder; and generate a reference image based on the concatenated feature vectors using a decoder of the conditional masked autoencoder, wherein the generated reference image is a reconstructed image of the optical image and the design image.

14. The system of claim 13, wherein the set of program instructions are further configured to cause the one or more processors to:

identify one or more defects on the sample by comparing the generated reference image to an optical image of the plurality of optical images.

15. The system of claim 13, wherein each image patch of the plurality of image patches has a patch size of 16×16 pixels.

16. The system of claim 13, wherein each image patch of the plurality of image patches has a patch size of 14×14 pixels.

17. The system of claim 13, wherein each image patch of the plurality of image patches has a patch size of 28×28 pixels.

18. The system of claim 13, wherein each image patch of the plurality of image patches has a patch size of 32×32 pixels.

19. The system of claim 13, wherein the characterization data includes defect inspection data from a broadband inspection system.

20. The system of claim 13, wherein the conditional masked autoencoder includes a self-supervised deep learning model.

21. The system of claim 20, wherein the first encoder and the second encoder include vision transformer encoders, wherein the decoder includes a vision transformer decoder.

22. The system of claim 13, wherein the optical subsystem includes a scanning electron microscopy sub-system.

23. The system of claim 22, wherein the optical image includes a scanning electron microscope (SEM) image.

24. A method comprising:

receiving an optical image of a sample;

generating a plurality of image patches by dividing the received optical image into the plurality of image patches;

generating a masked optical image by selectively masking a first set of image patches of the plurality of image patches based on characterization data, wherein the first set of image patches correspond to one or more defect regions, wherein the plurality of image patches includes a second set of image patches corresponding to one or more defect free regions;

providing the generated masked optical image to a first encoder of a conditional masked autoencoder;

applying the first encoder to the second set of image patches of the generated masked optical image to generate a first set of feature vectors;

receiving a design image;

providing the design image to a second encoder of the conditional masked autoencoder;

applying the second encoder to the design image to generate a second set of feature vectors;

concatenating the first set of feature vectors from the first encoder and the second set of feature vectors from the second encoder; and generating a reference image of the sample based on the concatenated feature vectors using a decoder of the conditional masked autoencoder, wherein the generated reference image is a reconstructed image of the optical image and the design image.

25. The method of claim 24, further comprising:

identifying one or more defects on the sample by comparing the generated reference image to an optical image of the plurality of optical images.

* * * * *